US008970292B2

(12) United States Patent
Giuroiu

(10) Patent No.: US 8,970,292 B2
(45) Date of Patent: Mar. 3, 2015

(54) UNIVERSAL FILTER IMPLEMENTING SECOND-ORDER TRANSFER FUNCTION

(75) Inventor: Horia Giuroiu, Campbell, CA (US)

(73) Assignee: Texas Instruments Incorporated, Dallas, TX (US)

( * ) Notice: Subject to any disclaimer, the term of this patent is extended or adjusted under 35 U.S.C. 154(b) by 213 days.

(21) Appl. No.: 13/364,073

(22) Filed: Feb. 1, 2012

(65) Prior Publication Data

US 2013/0194034 A1    Aug. 1, 2013

(51) Int. Cl.
    *H03B 1/00*        (2006.01)
    *H03K 5/00*        (2006.01)
    *H04B 1/10*        (2006.01)

(52) U.S. Cl.
    USPC .......................................................... 327/552

(58) Field of Classification Search
    USPC ................................................. 327/551–559
    See application file for complete search history.

(56) References Cited

U.S. PATENT DOCUMENTS

| | | | |
|---|---|---|---|
| 4,057,766 A | | 11/1977 | Lee |
| 4,466,107 A | * | 8/1984 | Stoner ............................ 375/259 |
| 4,593,250 A | * | 6/1986 | Lucas et al. .................... 330/107 |
| 5,049,831 A | * | 9/1991 | Westwick ....................... 330/107 |
| 5,412,335 A | * | 5/1995 | Jackson et al. ................. 327/552 |
| 5,596,650 A | * | 1/1997 | Hlibowicki .................... 381/103 |
| 5,751,184 A | * | 5/1998 | Shou et al. ..................... 327/552 |
| 6,255,905 B1 | * | 7/2001 | Gehrt ............................. 330/107 |
| 6,466,678 B1 | * | 10/2002 | Killion et al. .................. 381/314 |
| 6,965,275 B2 | * | 11/2005 | Di Giandomenico et al. ............................ 333/17.1 |
| 7,002,404 B2 | * | 2/2006 | Gaggl et al. ................... 327/553 |
| 7,038,531 B2 | * | 5/2006 | Cavazzoni ..................... 327/552 |
| 7,132,881 B2 | * | 11/2006 | Adan ............................. 327/554 |
| 7,683,703 B2 | * | 3/2010 | Cavazzoni ..................... 327/552 |

OTHER PUBLICATIONS

P.E. Fleischer et al., "Design Formulas for Biquad Active Filters Using Three Operational Amplifiers", IEEE Xplore, Proceedings of the IEEE, May 1973, pp. 662-663.
"Active RC Filters—A State-Space Realization", IEEE Xplore, Proceedings of the IEEE, Jun. 1968, pp. 1137-1139.
Chorng-Kuang Wang et al., "A BiCMOS Limiting Amplifier for SONET OC-3", IEEE Journal of Solid-State Circuits, vol. 31, No. 8, Aug. 1996, pp. 1197-1200.
Po-Chiun Huang et al., "A 2-V 10.7-MHz CMOS Limiting Amplifier/RSSI", IEEE Journal of Solid-State Circuits, vol. 35, No. 10, Oct. 2000, pp. 1474-1480.
Jung, Walt, OP Amp Applications Handbook, Analog Devices, Inc., Newnes, 2005, 85 pages, (see especially p. 5.85).

* cited by examiner

*Primary Examiner* — Lincoln Donovan
*Assistant Examiner* — Colleen O Toole
(74) *Attorney, Agent, or Firm* — Jacqueline J. Garner; Frederick J. Telecky, Jr.

(57) ABSTRACT

An apparatus includes a biquad filter having first and second lossy integrators and multiple input networks. Each lossy integrator includes an amplifier, and each input network is coupled to an input of the amplifier in one of the lossy integrators. Each input network includes multiple resistors and a capacitor arranged in a T-structure. In a single-ended configuration, each input network includes a grounded capacitor. In a fully-differential configuration, each input network includes one of: a grounded capacitor and a floating capacitor coupled to another input network. The amplifiers and resistors could form a portion of an integrated circuit chip, which also includes multiple input/output pins. A single grounded capacitor could be coupled to a single input/output pin of the integrated circuit chip for an input network. A single floating capacitor could be coupled to two input/output pins of the integrated circuit chip for a pair of input networks.

14 Claims, 6 Drawing Sheets

UNIVERSAL FILTER IMPLEMENTING SECOND-ORDER TRANSFER FUNCTION

TECHNICAL FIELD

This disclosure relates generally to electronic filters. More specifically, this disclosure relates to a universal filter implementing a second-order transfer function.

BACKGROUND

Active noise cancellation is a technique where undesirable noise is reduced or eliminated. This is typically done by detecting noise signals and generating inverted signals that counteract the noise signals. The inverted signals ideally have the same amplitude and an inverted phase as the detected noise signals. In practice, the inverted signals approximately match the amplitude and phase of the noise signals, and some noise still remains but at a substantially reduced level.

Some conventional noise cancellation techniques involve the use of Tow-Thomas biquad filters, which use three amplifiers (typically implemented within an integrated circuit chip). This architecture uses two capacitors in a single-ended design and four capacitors in a fully-differential design. For low-frequency/low-noise applications, the capacitors are typically external to the integrated circuit chip. Because of the standard Tow-Thomas design, an integrated circuit chip needs eight input/output pins in order to support fully-differential Tow-Thomas biquad filters. In a stereo architecture with two audio channels, eight capacitors and sixteen input/output pins would be needed. The large number of input/output pins increases the size and cost of the integrated circuit chips.

BRIEF DESCRIPTION OF DRAWINGS

For a more complete understanding of this disclosure and its features, reference is now made to the following description, taken in conjunction with the accompanying drawings, in which.

DETAILED DESCRIPTION

FIG. 1 through 6, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

Figure 1:
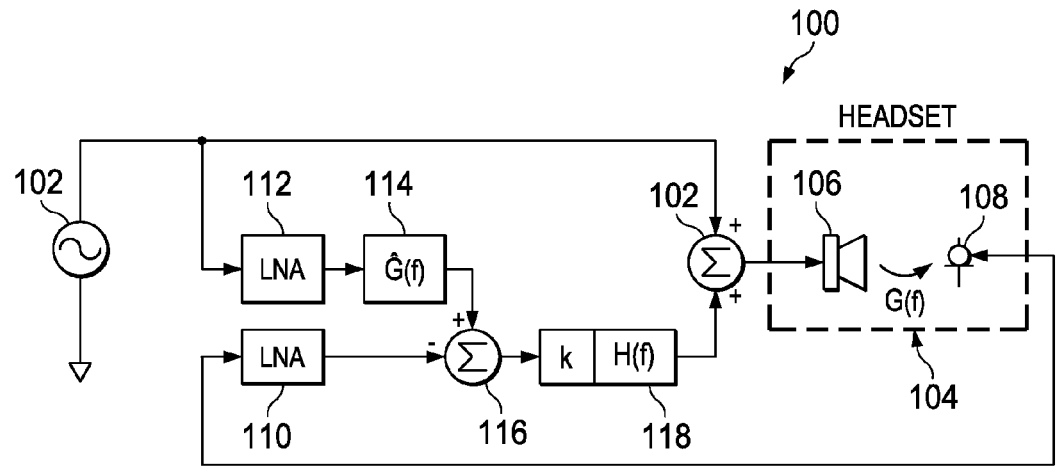
FIG. 1 illustrates an example active noise cancelling system according to this disclosure.

FIG. 1 illustrates an example active noise cancelling system 100 according to this disclosure. The system 100 receives an input signal that contains audio information (such as a varying input voltage) from a source 102. The source 102 represents any suitable source of audio information, such as a fixed or portable source. As particular examples, the source 102 could represent a mobile telephone, personal digital assistant, media player, or portable game console.

The system 100 uses the input signal to drive a headset 104, which includes at least one speaker 106. Any suitable headset 104 and speaker(s) 106 could be used with the system 100. For example, in some embodiments, the headset 104 includes multiple speakers, each associated with an ear cup that forms a cavity between the speaker and a user's head.

In this example, active noise cancellation is supported using a feedback noise cancellation technique with double injection of the input signal to help restore low-frequency content that is attenuated by the noise cancellation loop. The feedback noise cancellation technique uses a sensing microphone 108 in the headset 104, which provides information about audible signals (including undesirable noise) detected in the headset 104. The output of the microphone 108 is provided to a first low noise amplifier (LNA) 110, which amplifies the output of the microphone 108. The amplified output from the amplifier 110 is provided to a combiner 116.

Restoration of the low-frequency content uses another low noise amplifier 112, which amplifies the input signal. The amplified input signal is provided to a filter 114 that implements a transfer function $\hat{G}(f)$. The transfer function $\hat{G}(f)$ emulates a transfer function $G(f)$ of the electro-acoustic path in the headset 104. In some embodiments, the transfer function $\hat{G}(f)$ typically rolls off at a very low frequency, such as around 100 Hz. The filtered signal is provided to the combiner 116, which combines the outputs of the amplifier 110 and the filter 114.

An output of the combiner 116 is provided to a compensation filter 118, which applies additional processing to audio signals by applying a transfer function H(f). The compensation filter 118 can also apply a gain k to the output of the combiner 116. An output of the compensation filter 118 is provided to a combiner 120, which modifies the input signal with the output of the compensation filter 118. The input signal is therefore modified to provide noise cancellation, desired audio effects, and other features.

Each of the amplifiers 110-112 includes any suitable structure for amplifying an input signal. Each of the combiners 116 and 120 includes any suitable structure for combining input signals. The compensation filter 118 includes any suitable structure for applying compensation filtering to audio information. The filter 114 represents a biquad filter, for instance implementing a Tow-Thomas type of architecture. As described below, various second-order types of architectures are provided that include two lossy integrators with resistive feedback, resistor-resistor-capacitor T-structures as input networks of the lossy integrators, and optionally an operational amplifier-based inverting gain stage. These types of biquad filters can operate at lower frequencies, are fully programmable, and use half the number of external capacitors and half the number of input/output pins ((compared to conventional Tow-Thomas biquad architectures). These types of biquad filters are also said to be "universal" in that there are no restrictions in choosing the coefficients of a stable second-order transfer function (defined by poles and zeros) implemented using the biquad filters.

Although FIG. 1 illustrates one example of an active noise cancelling system 100, various changes may be made to FIG. 1. For instance, in the example shown in FIG. 1, a single input signal is used to drive a single speaker 104. However, multiple speakers could be driven using the same input signal. Also, the system 100 could be replicated to support multi-channel inputs and outputs, such as stereo inputs and outputs. In addition, while shown as being used to drive a headset 104, the biquad filter 114 could have other uses, including uses with other types of audio products.

Figure 2:
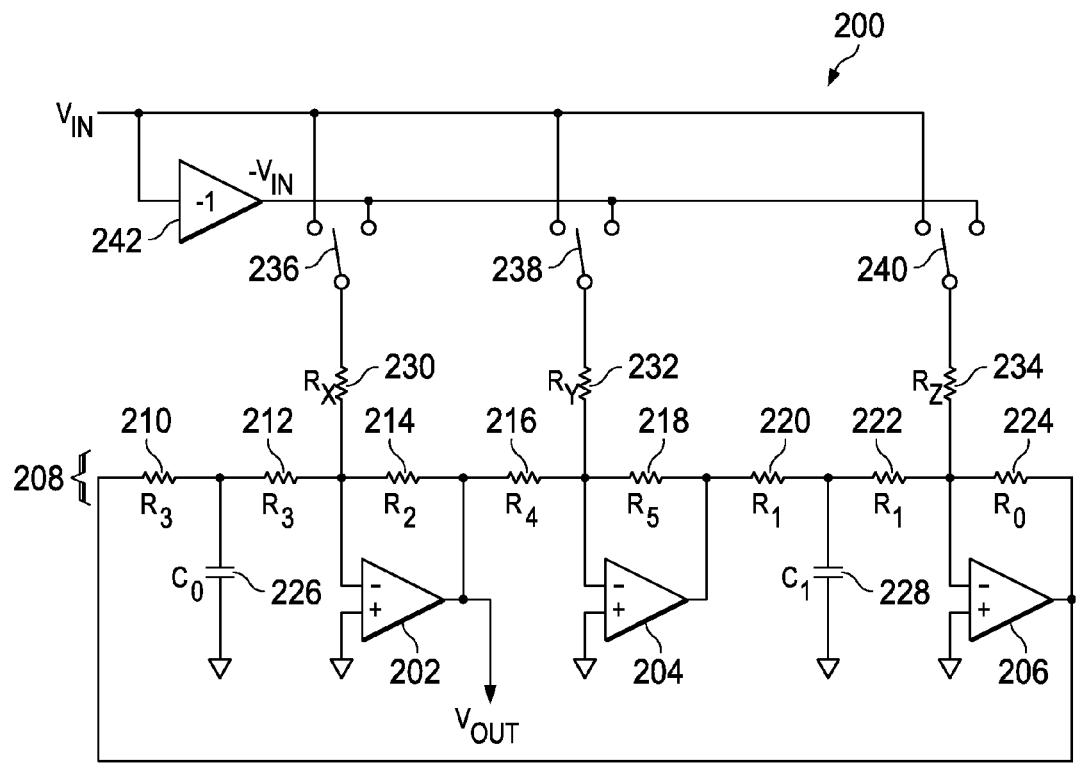
FIGS. 2 through 5 illustrate example universal filters implementing second-order transfer functions according to this disclosure.
Figure 3A:
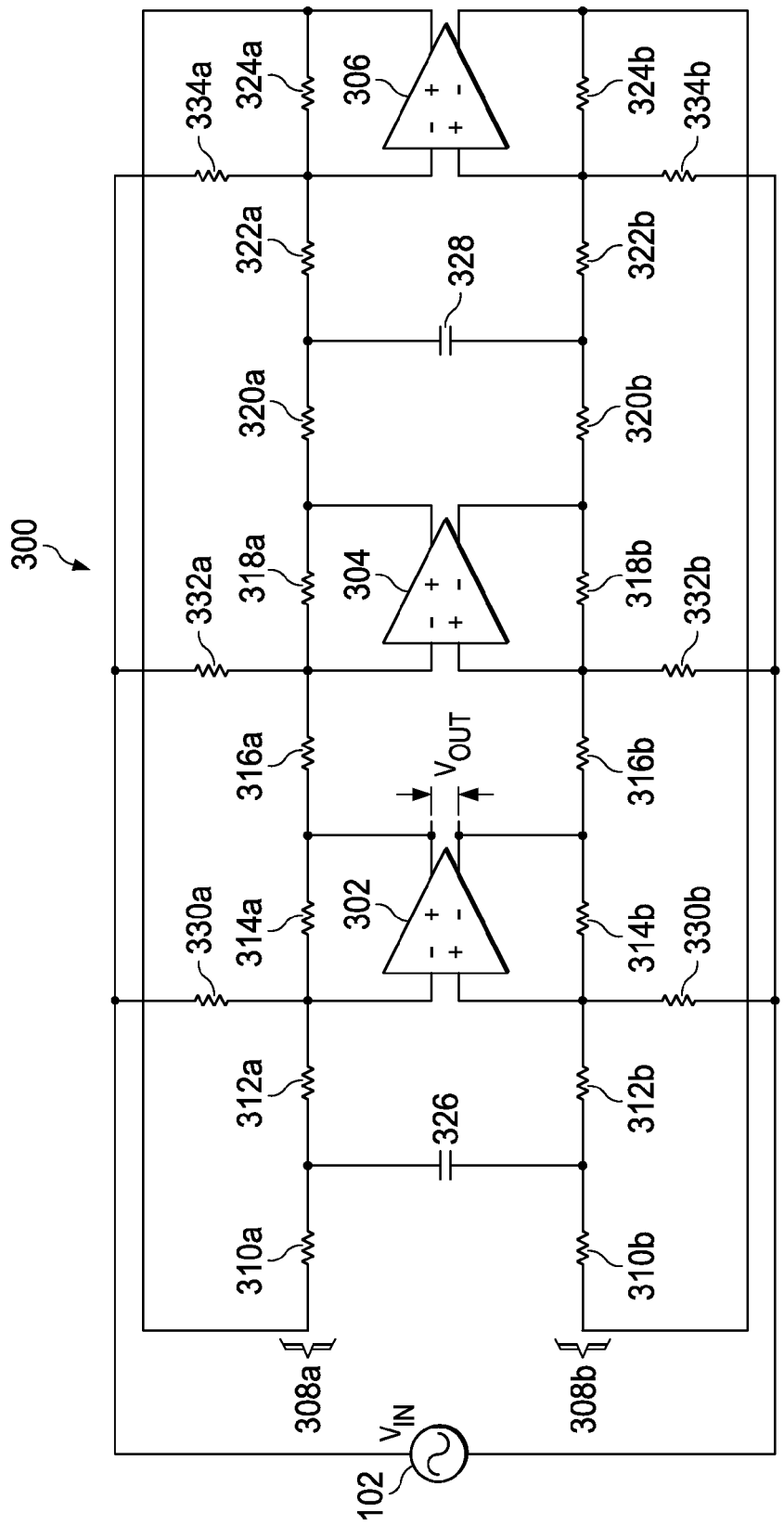
Figure 3B:
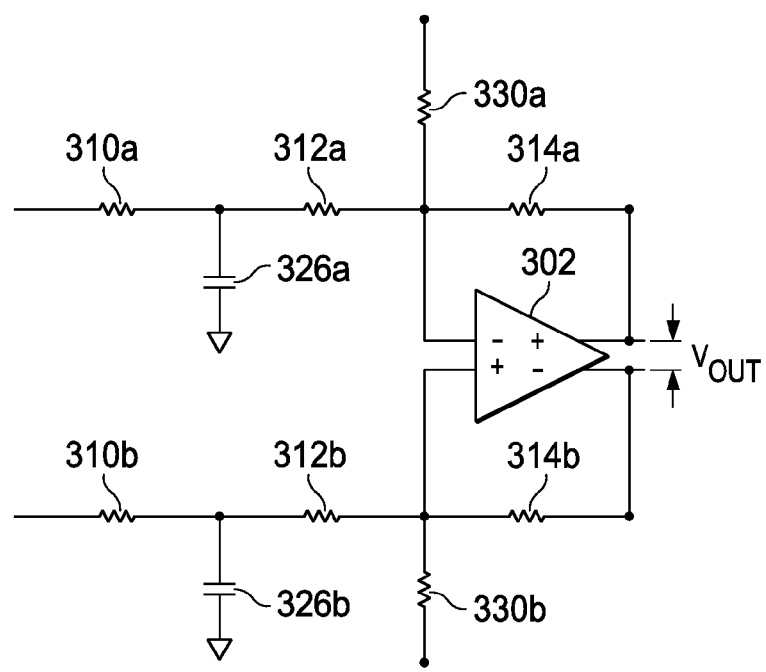
Figure 4:
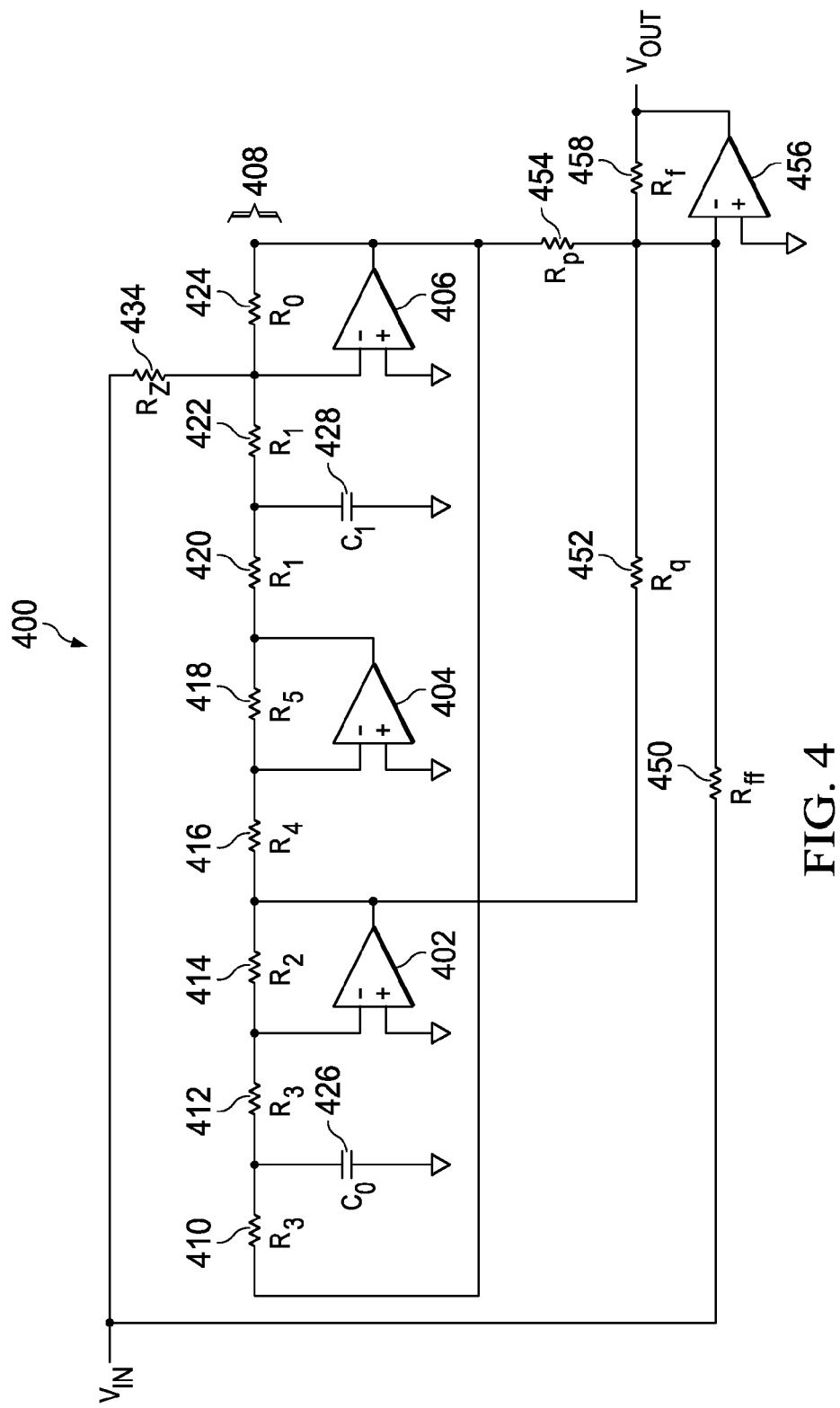
Figure 5:
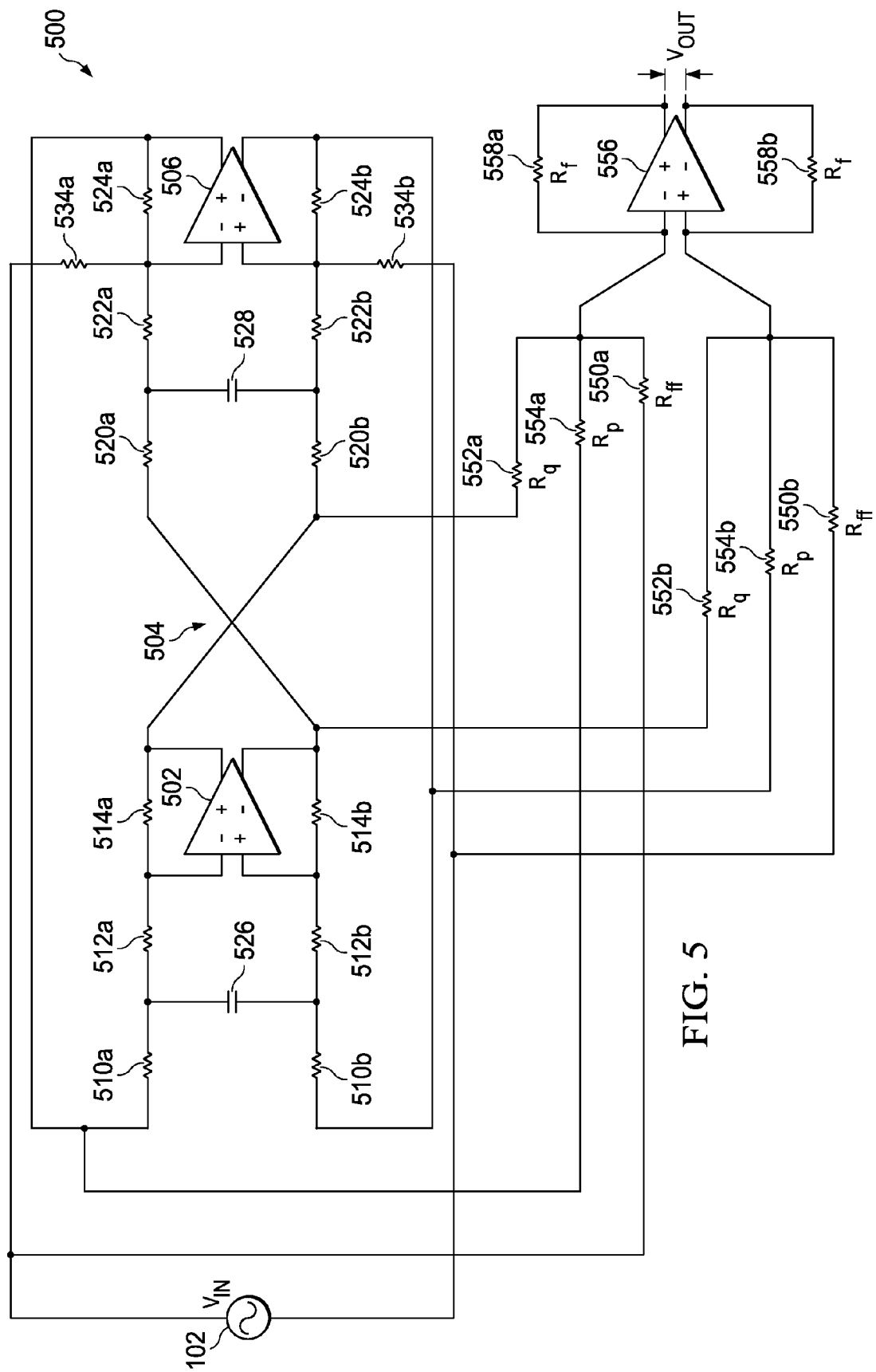

FIGS. 2 through 5 illustrate example universal filters implementing second-order transfer functions according to this disclosure. In particular, FIG. 2 illustrates an example single-ended biquad filter that uses grounded capacitors, and FIGS. 3A and 3B illustrate example fully-differential biquad filters that use floating or grounded capacitors. FIG. 4 illustrates another example single-ended biquad filter that uses grounded capacitors, and FIG. 5 illustrates another example fully-differential biquad filter that uses floating capacitors. All of these filters implement second-order types of architectures.

When used in systems such as noise cancellation applications, these biquad filters can support various features.

For example, the biquad filters can implement transmission zeros anywhere in the "s" plane. Also, the biquad filters can have low cutoff frequencies, such as about 100 Hz. Further, the biquad filters can have low noise since stages following the filters may have large gains. In addition, the biquad filters can have low distortions.

As shown in FIG. 2, a biquad filter 200 includes three amplifiers 202-206. Each amplifier 202-206 has a non-inverting input terminal coupled to ground and an inverting input terminal coupled to a resistor chain 208. Each amplifier 202-206 also has an output terminal coupled to the resistor chain 208. Each amplifier 202-206 operates to amplify a difference between its inputs. The biquad filter 200 receives an input signal $V_{IN}$, and the output of the amplifier 202 represents a filtered output signal $V_{OUT}$. Each amplifier 202-206 includes any suitable amplifier for amplifying a difference between its inputs, such as an operational amplifier.

The resistor chain 208 includes multiple resistors 210-224 coupled in series. The resistors 210-212 and a capacitor 226 form a first T-structure, which is used as an input network for the amplifier 202. The resistor 214 is a feedback resistor coupled between the output and inverting input terminals of the amplifier 202. The resistor 216 is coupled between the output terminal of the amplifier 202 and the inverting input terminal of the amplifier 204. The resistor 218 is a feedback resistor coupled between the output and inverting input terminals of the amplifier 204. The resistors 220-222 and a capacitor 228 form a second T-structure, which is used as an input network for the amplifier 206. The resistor 224 is a feedback resistor coupled between the output and inverting input terminals of the amplifier 206.

The resistor chain 208 is also coupled to resistors 230-234. Each resistor 230-234 is coupled to a corresponding switch 236-240. The switches 236-240 operate to selectively couple the resistors 230-234 to either the input signal $V_{IN}$ or an inverted input signal $-V_{IN}$. The selective use of the input signal $V_{IN}$ or the inverted input voltage $-V_{IN}$ allows the resistors 230-234 to take either positive or negative values. In this example, the inverted input voltage $-V_{IN}$ is generated using an amplifier 242 with a gain of $-1$.

In this example, the T-structures formed by the resistors 210-212, 220-222 and capacitors 226-228 are used as input networks for the amplifiers 202 and 206. The amplifiers 202, 206 and their input networks form lossy integrators, and the amplifier 204 operates as an inverting amplifier. Resistors only (no capacitors) are used as resistive feedback for the amplifiers 202 and 206. Also, resistors in the resistor chain 208 define the poles of the second-order transfer function implemented using the biquad filter 200, and the resistors 230-234 define the zeros of the second-order transfer function (since they inject currents proportional to the input signal $V_{IN}$ into summing nodes of the amplifiers 202-206).

The combination of a T-structure, an amplifier, and a resistor-only feedback connection creates a lossy integrator. However, unlike conventional structures, the capacitors 226-228 in the T-structures in FIG. 2 are grounded capacitors. This means that each capacitor 226-228 has one terminal coupled to ground, so each capacitor 226-228 has only one terminal coupled to the biquad filter 200. When various components in FIG. 2 (possibly all components except the capacitors 226-228) are implemented within an integrated circuit chip, only a single input/output pin is needed per capacitor 226-228.

Example operation of the biquad filter 200 can be defined as follows. Assume the desired or target transfer function is expressed as:

$$H(s) = \frac{\beta_2 s^2 + \beta_1 s + \beta_0}{s^2 + \alpha_1 s + \alpha_0}$$

where, for stability reasons, $\alpha_1 > 0$ and $\alpha_0 > 0$. The transfer function realized using the biquad filter 200 can be expressed as:

$$\frac{V_{OUT}(s)}{V_{IN}(s)} = -\frac{(x)s^2 + [2(a+b)x - (bd)z]s + ab(4x + (cd)y(2d)z)}{s^2 + 2(a+b)s + (cde+4)ab}$$

where:

$$G_0 = \frac{1}{R_0}; G_1 = \frac{1}{R_1}; G_2 = \frac{1}{R_2}; G_3 = \frac{1}{R_3}; G_4 = \frac{1}{R_4}; G_5 = \frac{1}{R_5}$$

$$a = \frac{G_1}{C_1} > 0; b = \frac{G_3}{C_0} > 0; c = \frac{G_1}{G_0} > 0; d = \frac{G_3}{G_2} > 0; e = \frac{G_4}{G_5} > 0$$

$$x = \frac{G_x}{G_2} \in R; y = \frac{G_y}{G_5} \in R; z = \frac{G_z}{G_0} \in R; G_x = \frac{1}{R_x}; G_y = \frac{1}{R_y}; G_z = \frac{1}{R_z}$$

$$cde > \max\left\{0, \frac{16\alpha_0}{\alpha_1^2} - 4\right\}$$

$$a = \frac{1}{2}\left[\frac{\alpha_1}{2} \sqrt{\left(\frac{\alpha_1}{2}\right)^2 - \frac{4\alpha_0}{cde+4}}\right]; b = \frac{1}{2}\left[\frac{\alpha_1}{2} + \sqrt{\left(\frac{\alpha_1}{2}\right)^2 - \frac{4\alpha_0}{cde+4}}\right]$$

$$x = \beta_2$$

$$y = \frac{1}{cd}\left[\frac{2}{b}(\alpha_1\beta_2 - \beta_1) + \frac{\beta_0}{ab} - 4\beta_2\right]$$

$$z = \frac{\alpha_1\beta_2 - \beta_1}{bd}$$

By tapping the output of the amplifier 202 as the output signal $V_{OUT}$, any stable second-order transfer function can be realized using the biquad filter 200. The biquad filter 200 also has several degrees of freedom that can be used to equalize the dynamic range and/or minimize the noise at the output of each amplifier 202-206.

Each resistor 210-224, 230-234 includes any suitable resistive structure having any suitable resistance. Each capacitor 226-228 includes any suitable capacitive structure having any suitable capacitance. Each switch 236-240 includes any suitable switching structure, such as a transistor. The amplifier 242 includes any suitable structure for inverting an input signal.

FIG. 3A illustrates a biquad filter 300 that operates in a similar manner as the biquad filter 200 of FIG. 2. However, the biquad filter 300 is fully-differential and is coupled to both positive and negative terminals of the source 102 (note that the amplifier 112 is omitted for simplicity).

As shown in FIG. 3A, the biquad filter 300 includes three differential amplifiers 302-306, and a differential output signal $V_{OUT}$ is generated by the amplifier 302. The biquad filter 300 also includes two resistor chains 308a-308b. Resistors 310a-312a and a capacitor 326 form a T-structure used as one input network for the amplifier 302, and resistors 310b-312b and the capacitor 326 form a second T-structure used as another input network for the amplifier 302. Resistors 314a-314b are feedback resistors coupled between respective output terminals and respective input terminals of the amplifier 302. Resistors 316a-316b are coupled between output terminals of the amplifier 302 and input terminals of the amplifier 304. Resistors 318a-318b are feedback resistors coupled between respective output terminals and respective input terminals of the amplifier 304. Resistors 320a-322a and a capacitor 328 form a T-structure used as one input network for the amplifier 306, and resistors 320b-322b and the capacitor 328 form a second T-structure used as another input network for the amplifier 306. Resistors 324a-324b are feedback resistors coupled between respective output terminals and respective input terminals of the amplifier 306.

Three resistors 330a-334a couple the resistor chain 308a to an upper rail, and three resistors 330b-334b couple the resistor chain 308b to a lower rail. Negative resistance values for the resistors 330a-334a and 330b-334b could be obtained by swapping the resistors' connections to the upper and lower rails. While not shown, switches could be used to selectively couple each resistor 330a-334a and 330b-334b to either the upper rail or the lower rail.

Note that it may be desired to keep the total resistance of the biquad filter 300 at least substantially equal to the total impedance of the biquad filter 200. If that is the case, the resistances of the resistors in the biquad filter 300 may be half the resistances of the corresponding resistors in the biquad filter 200. Also, the capacitances of the capacitors 326-328 in the biquad filter 300 may be twice the capacitances of the capacitors 226-228 in the biquad filter 200.

In the biquad filter 300 of FIG. 3A, the capacitors 326-328 are floating capacitors (no terminals are coupled directly to ground). If the capacitors 326-328 are placed outside of an integrated circuit chip, only four input/output pins are needed for the fully-differential biquad filter 300. External capacitors can have values that are much larger than the parasitic capacitances of the input/output pins, and the effects of the parasitics can be taken into account when designing the biquad filter 300. For special cases, small internal capacitors could be placed from each capacitor input/output pin to ground in order to compensate in frequency the common-mode loop.

Alternatively, for common-mode stability or other reasons, the use of grounded capacitors may be desired. In that case, the biquad filter 300 can be modified as shown in FIG. 3B. In FIG. 3B, the floating capacitor 326 has been replaced with two grounded capacitors 326a-326b. One grounded capacitor 326a forms part of the T-structure coupled to the inverting input terminal of the amplifier 302, and another grounded capacitor 326b forms part of the T-structure coupled to the non-inverting input terminal of the amplifier 302. The same arrangement can be used with the amplifier 306. This arrangement uses more capacitors than the design shown in FIG. 3A, but the number of input/output pins remains the same. Note that a combination of approaches could also be used, such as when one lossy integrator uses grounded capacitors and another lossy integrated uses a floating capacitor.

FIG. 4 illustrates another single-ended biquad filter 400. As shown in FIG. 4, the biquad filter 400 includes amplifiers 402-406, a resistor chain 408 containing resistors 410-424, and two capacitors 426-428. The input signal $V_{IN}$ is coupled to the resistor chain 408 via a resistor 434. These components are arranged in a manner similar to those shown in FIG. 2.

In FIG. 4, the output signal $V_{OUT}$ is not taken from the output of the amplifier 402, and a negative input signal $-V_{IN}$ and its related components may not be needed in FIG. 4. Instead, the input signal $V_{IN}$ and the outputs of the amplifiers 402, 406 are coupled to additional circuitry. Namely, the input signal $V_{IN}$ is coupled to a resistor 450, the output of the amplifier 402 is coupled to a resistor 452, and the output of the amplifier 406 is coupled to a resistor 454. The resistors 450-454 are coupled to the inverting input terminal of an amplifier 456, which has its non-inverting input terminal grounded. A feedback resistor 458 is coupled between the output and inverting input terminals of the amplifier 456.

Example operation of the biquad filter 400 can be defined as follows. The transfer function realized using the biquad filter 400 can be expressed as:

$$\frac{V_{OUT}(s)}{V_{IN}(s)} = \frac{(pz-\varphi)s^2 + [2(pz-\varphi)(a+b) - (bdq)z]}{s + [4(pz-\varphi) - (cd)\varphi - (2dq)z]ab}{s^2 + 2(a+b)s + (cd+4)ab}$$

where:

$$G_0 = \frac{1}{R_0}; G_1 = \frac{1}{R_1}; G_2 = \frac{1}{R_2}; G_3 = \frac{1}{R_3}; G_4 = \frac{1}{R_4}; G_5 = \frac{1}{R_5}$$

$$G_p = \frac{1}{R_p}; G_q = \frac{1}{R_q}; G_f = \frac{1}{R_f}; G_{ff} = \frac{1}{R_{ff}}$$

$$a = \frac{G_1}{C_1} > 0; b = \frac{G_3}{C_0} > 0; c = \frac{G_1}{G_0} > 0; d = \frac{G_3}{G_2} > 0; R_4 = R_5$$

$$z = \frac{G_z}{G_0} \in R; \varphi = \frac{G_{ff}}{G_f} \in R; p = \frac{G_p}{G_f} \in R; q = \frac{G_q}{G_f} \in R$$

$$cd > \max\left\{0, \frac{16\alpha_0}{\alpha_1^2} - 4\right\}$$

$$a = \frac{1}{2}\left[\frac{\alpha_1}{2} - \sqrt{\left(\frac{\alpha_1}{2}\right)^2 - \frac{4\alpha_0}{cd+4}}\right]; b = \frac{1}{2}\left[\frac{\alpha_1}{2} + \sqrt{\left(\frac{\alpha_1}{2}\right)^2 - \frac{4\alpha_0}{cd+4}}\right]$$

$$\varphi = \frac{4\beta_2 - 2dqz - \frac{\beta_0}{ab}}{cd}; p = \frac{\beta_2 + \varphi}{z}; q = \frac{\alpha_1\beta_2 - \beta_1}{bdz}$$

In FIG. 4, the biquad filter 400 implements a generic second-order transfer function by the weighted summation of the input signal $V_{IN}$ and outputs from the amplifiers 402 and 406. The resistance values of the resistors 450-454 define the weights used in the summation. The zeros of the transfer function are implemented using this summation. Note that a negative value for the z, φ, p, or q coefficient can be obtained by driving the associated resistor with an inverted signal ($-V_{IN}$ for $R_z$; an inverted output of the amplifier 402 for $R_q$; an inverted output of the amplifier 406 for $R_p$). While not shown, switches could be used to selectively couple the corresponding resistors to either their inverted or non-inverted signals.

FIG. 5 illustrates a biquad filter 500 that operates in a similar manner as the biquad filter 400 of FIG. 4. However, the biquad filter 500 is fully-differential and is coupled to both terminals of the source 102 (again note that the amplifier 112 is omitted for simplicity).

As shown in FIG. 5, the biquad filter 500 includes two differential amplifiers 502 and 506 and two resistor chains. Here, because $R_4=R_5$ in FIG. 4, the middle amplifier 404 can be replaced by a cross-coupled connection 504. As a result, one resistor chain includes resistors 510a-514a and 520b-524b, while another resistor chain includes resistors 510b-

514b and 520a-524a. The resistors 510a-512a and a capacitor 526 form a T-structure used as one input network for the amplifier 502, and resistors 510a-512b and the capacitor 526 form a second T-structure used as another input network for the amplifier 502. Resistors 514a-514b are feedback resistors coupled between respective output terminals and respective input terminals of the amplifier 502. Resistors 520a-522a and a capacitor 528 form a T-structure used as one input network for the amplifier 506, and resistors 520b-522b and the capacitor 528 form a second T-structure used as another input network for the amplifier 506. Resistors 524a-524b are feedback resistors coupled between respective output terminals and respective input terminals of the amplifier 506. One resistor chain is coupled to an upper rail by a resistor 534a, and the other resistor chain is coupled to a lower rail by a resistor 534b.

Again, negative resistance values for the resistors 534a-534b could be obtained by swapping the resistors' connections to the upper and lower rails, which could be done using switches.

To support the weighted summation described above, multiple resistors 550a-554a are coupled to the inverting input terminal of a differential amplifier 556, and multiple resistors 550b-554b are coupled to the non-inverting input terminal of the differential amplifier 556. Feedback resistors 558a-558b are coupled between the respective output terminals and the respective input terminals of the amplifier 556. The amplifier 556 generates the output signal $V_{OUT}$.

Note that FIG. 5 uses floating capacitors 526-528 in the design. If grounded capacitors are desired, a modification similar to that shown in FIG. 3B can be used in FIG. 5.

With the various designed shown in FIGS. 2 through 5, the biquad filters 200-500 can obtain low-noise and low-distortion operation while implementing any stable second-order transfer function with a minimum number of capacitors. Moreover, fully-differential designs can be used. These structures may be particularly useful when the large values of the capacitors make their integration into an integrated circuit chip infeasible or uneconomical (although on-chip capacitors are also possible). Further, compared to conventional differential structures, the filters here can allow for a significant reduction in the sizes of the external capacitors (such as a 75% reduction in size for the same signal-to-noise ratio). The structures therefore provide a compact implementation even for fully integrated filters with on-chip capacitors.

The fully-differential structures above may be necessary or desired over the single-ended structures in certain situations. For example, if being powered by a 3.3V or other "high" supply in a quiet (clockless) environment, the use of single-ended signaling may be adequate. However, if being powered by a 1.8V or other "low" supply in an actively clocked environment, the low-voltage operation and the noisy environment may benefit from the use of fully-differential signaling. As particular examples, fully-differential signaling may be useful in applications such as DC-DC converters, digital blocks, class-G headphone amplifiers, and class-D speaker amplifiers.

Note that specific resistance and capacitance values for each of the biquad filters 200-500 could be determined in any suitable manner. For example, the equations provided above can be used to identify the resistance and capacitance values based on the desired second-order transfer function to be implemented. The determination of the resistance and capacitance values can be an underdetermined problem, meaning that there may be more unknowns than equations, so some of the resistance or capacitance values can be arbitrarily chosen. Also, this means that there is room to introduce additional constraints (like noise performance and/or dynamic range constraints). An optimization algorithm could therefore be used to select resistance and capacitance values of a biquad filter while optimizing particular characteristics of the biquad filter. As particular examples, the resistance and capacitance values could be selected to provide amplifier dynamic ranges close to each other (such as within 1 dB of each other) while maintaining thermal noise within specified limits.

Although FIGS. 2 through 5 illustrate examples of universal filters implementing second-order transfer functions, various changes may be made to FIGS. 2 through 5. For example, while certain circuit components are shown in these figures and described above, each of these circuit components could be replaced by other component(s) that perform the same or similar function.

Figure 6:
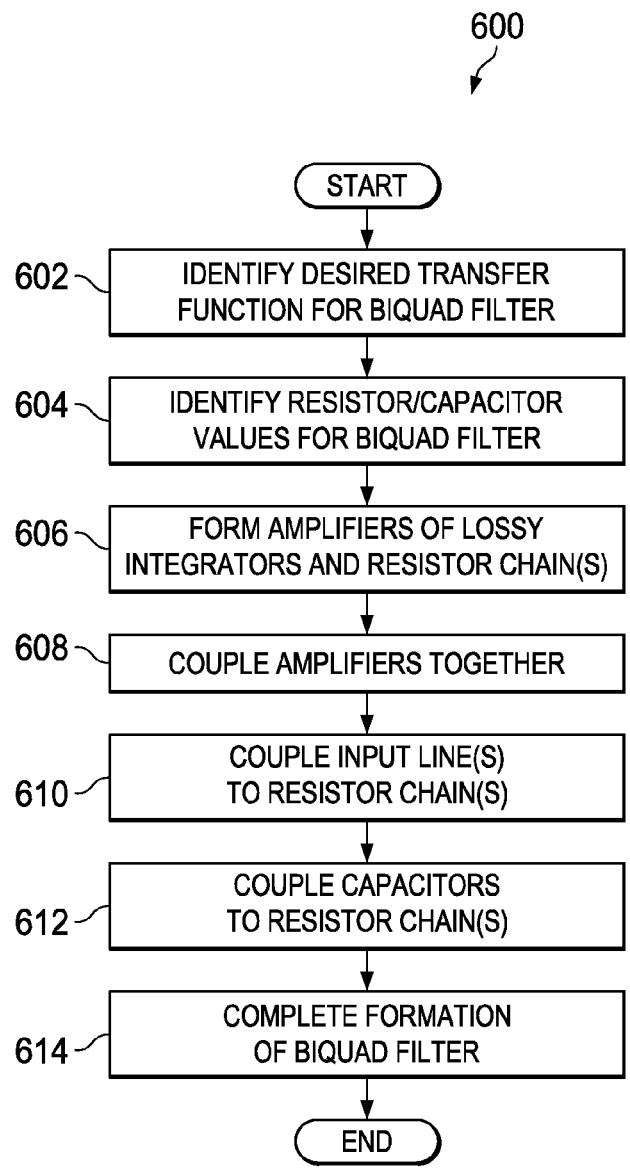
FIG. 6 illustrates an example method for forming a universal filter implementing a second-order transfer function according to this disclosure.

FIG. 6 illustrates an example method 600 for forming a universal filter implementing a second-order transfer function according to this disclosure. As shown in FIG. 6, a desired transfer function for a biquad filter is identified at step 602, and resistor and capacitor values for the biquad filter are identified based on the transfer function at step 604. The transfer function could be generated in any suitable manner and varies depending on the application in which the biquad filter is used. The resistor and capacitor values can be determined as described above, such as by arbitrarily selecting some resistor or capacitor values and using the equations above or an optimization algorithm.

Amplifiers for multiple lossy integrators and one or more resistor chains are formed at step 606. This could include, for example, forming multiple operational amplifiers and coupling various terminals of the operational amplifiers to different resistors coupled in series in the resistor chain(s). The amplifiers are also coupled together at step 608. This could include, for example, coupling the amplifiers together through an intermediate inverting amplifier or using a cross-coupled connection. One or more input lines are coupled to the resistor chain(s) at step 610. This could include, for example, coupling an upper rail and possibly a lower rail to one or more resistor chains through one or more resistors.

Capacitors are coupled to the resistor chain(s) at step 612. The coupling of the capacitors to the resistor chain(s) can complete the formation of the T-structures, thereby completing the formation of the lossy integrators. If the lossy integrators and resistor chain(s) are formed within an integrated circuit chip, this could include coupling grounded or floating capacitors to the integrated circuit chip. This could also include forming the capacitors internally within an integrated circuit chip along with the lossy integrators and resistor chain(s).

Formation of the biquad filter is completed at step 614. This could include, for example, forming any remaining connections necessary for the biquad filter's operation.

Although FIG. 6 illustrates one example of a method 600 for forming a universal filter implementing a second-order transfer function, various changes may be made to FIG. 6. For example, while shown as a series of steps, various steps in FIG. 6 could overlap, occur in parallel, or occur in a different order.

It may be advantageous to set forth definitions of certain words and phrases used throughout this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrase "associated with," as well as derivatives thereof, may mean to include, be included within, interconnect with; contain, be contained within, connect to or with, couple to or with, be communicable with, cooperate with, interleave, juxtapose, be proximate to, be bound to or with, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A differential biquad filter circuit which receives a differential input signal and implements a predetermined transfer function to provide a differential output signal, comprising:

A first amplifier having positive and negative input terminals, and positive and negative output terminals;

a first input and feedback network comprising:

a first resistor having a first terminal for receiving the negative side of the differential input signal, and a second terminal coupled to the negative input terminal of the first amplifier;

a second resistor having a first terminal coupled to the positive side of the differential input signal and a second terminal coupled to positive input terminal of the first amplifier, wherein the resistance value of the first and second resistors is equal;

a third resistor having first and second terminals, wherein the first terminal is coupled to the second terminal of the first resistor;

a fourth resistor having first and second terminals, wherein the first terminal is coupled to the second terminal of the second resistor, also wherein the resistance value of the third and fourth resistors is equal;

a first capacitor coupled between the second terminal of the third resistor and the second terminal of the fourth resistor;

a fifth resistor having first and second terminals, wherein the first terminal is coupled to the second terminal of the third resistor;

a sixth resistor having first and second terminals, where the first terminal is coupled to the second terminal of the fourth resistor, wherein the resistance value of the fifth and sixth resistors is equal;

a seventh resistor coupled between the negative input of the first amplifier and the positive output of the first amplifier;

an eighth resistor coupled between the positive input of the first amplifier and the negative output of the first amplifier, wherein the resistance value of the seventh and eighth resistors is equal;

a second amplifier having positive and negative input terminals, and positive and negative output terminals;

a second input and feedback network comprising:

a ninth resistor having first and second terminals, wherein the first terminal receives the negative side of the differential input signal, and the second terminal is coupled to the negative input terminal of the second amplifier;

a tenth resistor having first and second terminals, wherein the first terminal receives the positive side of the differential input signal and s second terminal is coupled to positive input terminal of the second amplifier, wherein the resistance value of the ninth and tenth resistors is equal;

an eleventh resistor coupled between the positive output of the first amplifier and the negative input of the second amplifier;

a twelfth resistor coupled between the negative output of the first amplifier and the positive input of the second amplifier, wherein the resistance value of the eleventh and twelfth resistors is equal;

a thirteenth resistor coupled between the negative input of the second amplifier and the positive output of the second amplifier;

a fourteenth resistor coupled between the positive input of the second amplifier and the negative output of the second amplifier, wherein the resistance value of the thirteenth and fourteenth resistors is equal;

a third amplifier having positive and negative input terminals, and positive and negative output terminals;

a third input and feedback network comprising:

a fifteenth resistor having a first terminal for receiving the negative side of the differential input signal, and a second terminal coupled to the negative input terminal of the third amplifier;

a sixteenth resistor having a first terminal coupled to the positive side of the differential input signal and s second terminal coupled to positive input terminal of the third amplifier, wherein the resistance value of the fifteenth and sixteenth resistors is equal;

a seventeenth resistor having first and second terminals, wherein the first terminal is coupled to the second terminal of the fifteenth resistor;

an eighteenth resistor having first and second terminals, wherein the first terminal is coupled to the second terminal of the sixteenth resistor, wherein the resistance value of the seventeenth and eighteenth resistors is equal;

a second capacitor coupled between the second terminal of the seventeenth resistor and the second terminal of the eighteenth resistor;

a nineteenth resistor having a first terminal coupled to the second terminal of the seventeenth resistor and a second terminal coupled to the positive output of the second amplifier;

a twentieth resistor having a first terminal coupled to the second terminal of the eighteenth resistor and a second terminal coupled to the negative output of the second amplifier, wherein the resistance value of the nineteenth and twentieth resistors is equal;

a twenty first resistor coupled between the negative input of the third amplifier, the positive output of the third amplifier, wherein the positive output of the third amplifier is coupled to the second terminal of the fifth resistor;

a twenty second resistor coupled between the positive input of the third amplifier, the negative output of the third amplifier, wherein the negative output of the third amplifier is coupled to the second terminal of the sixth resistor, wherein the resistance value of the twenty first and twenty second resistors is equal; and the circuit is configured to receive a differential input signal and implement a predetermined transfer function to provide a filtered differential output signal on the outputs of the first amplifier.

2. The differential biquad filter of claim 1 wherein the first amplifier and the first through eight resistors are configured to form a fully differential lossy integrator to enable the implementation of a predetermined transfer function.

3. The differential biquad filter of claim 1 wherein the third amplifier and the fifteenth through the twenty second resistors are configured to form a fully differential lossy integrator to enable the implementation of a predetermined transfer function.

4. The differential biquad filter of claim 1 wherein the second amplifier and the ninth through the fourteenth resistor are configured to form a fully differential inverting amplifier.

5. The differential biquad filter of claim 1 is configured to receive a fully differential input signal and generate a fully differential filtered output on the output of the first amplifier.

6. The differential biquad filter of claim 1 is configured to receive an input signal and provide on output signal comprised of a weighted summation of the input signal, the output of the first amplifier and output of the third amplifier.

7. A single-ended biquad filter circuit which receives a single-ended input signal and implements a predetermined transfer function to provide a single-ended output signal, comprising:
   A first inverter having an input and an output, wherein an input signal provides both an input signal Vin and an inverted input signal through the first inverter;
   a first amplifier having positive and negative input terminals, and an output terminal;
   a first input and feedback network comprising:
      a first resistor having first and second terminals, wherein the first terminal is for receiving an input signal and the second terminal is coupled to the negative input terminal of the first amplifier;
      a second resistor having first and second terminals, wherein the first terminal is coupled to the second terminal of the first resistor;
      a first capacitor coupled between the second terminal of the second resistor and ground;
      a third resistor having first and second terminals, wherein the first terminal is coupled to the second terminal of the second resistor;
      a fourth resistor coupled between the negative input of the first amplifier and the positive output of the first amplifier, wherein the positive input of the first amplifier is grounded;
   a second amplifier having positive and negative input terminals, and an output terminal;
   a second input and feedback network comprising:
      a fifth resistor having a first terminal, wherein the first terminal is for receiving an input signal and the second terminal is coupled to the negative input terminal of the second amplifier;
      a sixth resistor coupled between the output of the first amplifier and the negative input of the second amplifier;
      a seventh resistor coupled between the negative input of the second amplifier and the output of the second amplifier, wherein the positive input of the second amplifier is grounded;
   a third amplifier having positive and negative input terminals, and an output terminal;
   a third input and feedback network comprising:
      an eighth resistor having first and second terminals, wherein the first terminal is for receiving an input signal and the second terminal is coupled to the negative input terminal of the third amplifier;
      a ninth resistor having first and second terminals, wherein the first terminal is coupled to the second terminal of the first resistor;
      a second capacitor coupled between the second terminal of the ninth resistor and ground;
      a tenth resistor is coupled between the second terminal of the ninth resistor and the output of the second amplifier;
      an eleventh resistor is coupled between the negative input of the first amplifier, the output of the third amplifier, wherein the output of the third amplifier is coupled to the second terminal of the third resistor, and also wherein the positive terminal of the third amplifier is coupled to ground; and
      the circuit is configured to receive a single-ended input signal and implement a predetermined transfer function to provide a filtered single-ended output signal on the output of the first amplifier.

8. The single-ended biquad filter of claim 7 wherein the first amplifier and the first through fourth resistors are configured to form a singled-ended lossy integrator to enable the implementation of a predetermined transfer function.

9. The single-ended biquad filter of claim 7 wherein the third amplifier and the eighth through the eleventh resistors are configured to form a single ended lossy integrator to enable the implementation of a predetermined transfer function.

10. The single-ended biquad filter of claim 7 wherein the second amplifier and the ninth through the fourteenth resistors are configured to form an inverting amplifier.

11. The single-ended biquad filter of claim 7 is configured to receive a single-ended input signal and generate a single-ended filtered output on the output of the first amplifier.

12. The single-ended biquad filter of claim 7 is configured to receive an input signal and provide on output signal comprised of a weighted summation of the input signal, the output of the first amplifier and output of the third amplifier.

13. The single-ended biquad filter of claim 7, wherein the first terminal of the eighth resistor is coupled to the input signal Vin for receiving an input signal and the first terminals of the first and fifth resistors are not coupled to the input signal, wherein the output circuit comprises:
   a fourth amplifier having positive and negative input terminals, and an output terminal, wherein the positive input terminal is grounded;
   a twelfth resistor coupled between the negative input terminal of the fourth amplifier and the output of the fourth amplifier, wherein the single-ended biquad output signal is produced on the output of the fourth amplifier;
   a thirteenth resistor coupled between the negative input terminal of the fourth amplifier and the output of the third amplifier;
   a fourteenth resistor coupled between the negative input terminal of the fourth amplifier and the output of the first amplifier; and
   a fifteenth resistor coupled between the negative input terminal of the fourth amplifier and the input signal.

14. The single-ended biquad filter of claim 7 wherein the biquad filter comprises multiple switches, each switch configured to selectively couple at least one of the first terminals of the first, fifth or eighth resistors to one of: the input signal or an inverted input signal.

* * * * *